United States Patent [19]

Schnur et al.

[11] Patent Number: 5,004,566
[45] Date of Patent: Apr. 2, 1991

[54] PROCESS FOR FABRICATION OF LIPID MICROSTRUCTURES FROM DRY ORGANIC SOLVENT

[75] Inventors: Joel M. Schnur, Burke, Va.; Alan S. Rudolph, Bowie; Mary A. Testoff, Greenbelt, both of Md.

[73] Assignee: Geo-Centers, Inc., Fort Washington, Md.

[21] Appl. No.: 416,915

[22] Filed: Oct. 4, 1989

Related U.S. Application Data

[63] Continuation-in-part of Ser. No. 11,838, Feb. 6, 1987, Pat. No. 4,877,501.

[51] Int. Cl.$^5$ .............................. C07F 9/00; C11B 3/00
[52] U.S. Cl. ................................. 260/403; 260/407; 260/426; 260/428.5; 264/165; 264/236
[58] Field of Search ............... 260/398, 398.5, 403, 260/405.6, 407, 410.7, 426, 428.5; 264/165, 236

[56] References Cited

U.S. PATENT DOCUMENTS 4,489,133 12/1984 Kornberg ..................... 428/478.2
4,560,599 12/1985 Regen ................... 260/403
4,634,599 1/1987 Uzgiris ..................... 428/478.2

OTHER PUBLICATIONS

Yager et al., *Mol. Cryst. Liq. Cryst.*, 1984, vol. 106, 371–381.
Yager et al., *Biophysical Journal*, 1985, vol. 48, 899–906.
Nakashima et al., *J.A.C.S.*, 1985, vol. 107, 509–510.

*Primary Examiner*—John F. Niebling
*Assistant Examiner*—Ben C. Hsing
*Attorney, Agent, or Firm*—Wolf, Greenfield & Sacks

[57] ABSTRACT

Process for forming tubular microstructures having predetermined shape and dimension from surfactants comprising the steps of selecting a lipid which self-aggregates into a tubular microstructure; selecting a lipid solvating organic solvent in which tubules may form; removing trace water from the selected organic solvent; dissolving the selected lipid in the dried organic solvent; allowing the dissolved lipid to grow into tubular microstructures in the dried organic solvent for a selected period of time and at a temperature below the melting point of the selected lipid.

14 Claims, No Drawings

PROCESS FOR FABRICATION OF LIPID MICROSTRUCTURES FROM DRY ORGANIC SOLVENT

GOVERNMENT RIGHTS IN THE INVENTION

This invention was made jointly by two employees of the Naval Research Laboratory, Washington, D.C. and one employee of Geo-Centers, Inc. The Geo-Centers employee, at the time the invention was made, was in the performance of work under Naval Research Laboratory's contract N00014-86-C-2540 with Geo-Centers. The United States of America has certain rights in the invention arising out of that contract, including a non-exclusive, nontransferable, irrevocable, paid-up license to practice the invention or have it practiced for or on behalf of the United States throughout the world. The United States of America may also have rights in the invention derived from the two employees of the Naval Research Laboratory who are joint inventors of this invention.

CROSS-REFERENCE TO RELATED APPLICATIONS

This application is a continuation-in-part of U.S. Pat. No. Application Ser. No. 011,838 filed Feb. 6, 1987.

BACKGROUND OF THE INVENTION

The present invention relates to the fabrication of lipid microstructures and in particular to the selective formation of tubular microstructures. Selected surfactants such as lipids are known to self-organize into a variety of structures with dimensions on the micron and submicron scale.

Heretofore, methods for fabricating lipid microstructures have relied primarily on the presence of bulk water in or at least on the addition or presence of some amount of water to the solvent medium in which a suitable lipid is dissolved. The present invention achieves microstructure formation in the essential total absence of water. Such totally waterless about 10° C below the melting point of the selected lipid over synthetic procedures are advantageous in applications where the presence of water is not acceptable and its removal from the solvent medium requires time consuming and costly removal procedures.

Under typical conditions lipids tend to form into a variety of geometrical forms with little control over dimension and shape. Heretofore synthetic control over the specific geometrical form and dimensions of such microstructures has been difficult except in cases involving lipid vesicles. The present invention achieves a method for the rational control of the dimensions of tubular microstructures. Such microstructures may be metallized and are particularly useful in the fabrication of small electrical circuits.

SUMMARY OF THE INVENTION

In accordance with the invention there is provided a process for forming tubular microstructures having predetermined shape and dimension from surfactants comprising the steps of selecting a lipid which self-aggregates into a tubular microstructure; selecting a lipid solvating organic solvent in which tubules may form; removing trace water from the selected organic solvent; dissolving the selected lipid in the dried organic solvent; allowing the dissolved lipid to grow into tubular microstructures in the dried organic solvent for a selected period of time and at a temperature below the melting point of the selected lipid.

Preferably the selected organic solvent has a dielectric constant of between about 25 and about 80.

The step of allowing typically comprises bringing the temperature of the dried organic solvent to at least about 15–20° C. above the melting point of the selected lipid and slowly cooling the organic solvent to a temperature at least about 10° C. below the melting point of the selected lipid over at least about 90–120 minutes.

Most preferably the organic solvent is selected from the group of acetonitrile, dimethylamine, dibutylamine, polyethylene glycol, isobutanol, t-butanol, amyl alcohol, diethylamine, trimethylamine, acetone and dimethyl sulfoxide (or DMSO). The concentration of the lipid dissolved in the dried organic solvent lipid solution is typically preselected to be less than about 2 mg/ml.

The backbone of the selected surfactant is typically derived from glycerol.

The lipid is most preferably selected to include one or two hydrocarbon chains, one or both of which include a diacetylenic moiety in conjugation within the chains.

The tubular microstructures thus formed may be ruggedized by exposing the selected lipid solution for a predetermined period of time to high energy radiation which is capable of polymerizing the lipid.

The present invention most preferably utilizes surfactants having the following formula I:

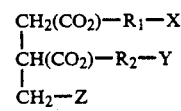

wherein $R_1$ and $R_2$ (attached to a glycerol based backbone) are typically a saturated or unsaturated hydrocarbon having from about 4 to 32 carbon atoms, X and Y are typically an alkyl or olefin having fewer than about 16 carbon atoms or an alpha, beta unsaturated carboxy moiety, and Z is a phosphoryl moiety such as phosphoryl ethanolamine, choline, serine, inositol, glycerol, 3'-O-aminoacyl glycerol, cardiolipin or other phosphoryl group found in naturally occurring phosphoglycerides.

Lipids which are especially capable of rapid formation of the selected helical and tubular microstructures are those having hydrocarbon chains such as $R_1$ and $R_2$ which contain diacetylenic moieties, preferably in conjugation. Most preferably phospholipids having the following formula II are used herein:

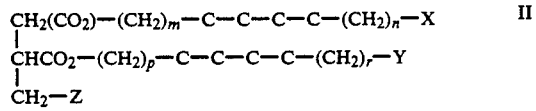

where m and p are 5, 6, 7, 8, 9, 10, or 11, and n and r are 7, 8, 9, 10, 11, 12, 13, 14, 15, or 16 and where X, Y and Z are as mentioned above.

The ready and reproducible formation of tubular microstructures having a diameter of between about 0.1 and about 3.0 microns, and selected lengths of less than about 1500 microns is achieved herein. The inventive process herein enables the formation of tubular microstructures formed from the above-referenced surfactants and further enables the formation of tubules having preselected lengths and diameters by selective variation of, inter alia, the composition of solvent in which the lipids are dispersed, the time of reaction, the temperature of the reaction mixture, the concentration of lipid in the solution, and the exposure and/or non-exposure of the reaction mixture to high energy ionizing (polymerizing) radiation during and after tubule formation.

DETAILED DESCRIPTION OF PREFERRED EMBODIMENTS

It is well known in the art that self-assembling lipids may be crystallized out of a solution in which water is present to form certain microstructures such as tubules, helices and liposomes. Such microstructure forming techniques have typically relied on the presence of bulk water in the solution or, as found in more recent studies using primarily organic solvent medium, on the presence or addition of at least some amount of water. In the present invention, the organic solvent medium is completely dried such that essentially no water is present prior to dissolution of the self-assembling lipid therein. Tubules and new structures, spherulites (sheet-like lamellar structures) may be formed according to the invention in at least certain organic solvents which have been completely dried. The formation of spherulites are also peculiar to the novel process herein described. As known in the art spherulites, unlike liposomes, tubules and helices, are layered structures within a crystalline lattice having focal conic texture (or domains). In lay terms, spherulites appear to have a jelly-roll configuration.

A selected surfactant I is preferably first dispersed in an organic solvent which is dried so as to remove essentially all of the water therein. The selected surfactants most preferably used in the invention are "self-assembling" or "self-aggregating" lipids which are well known in the art. Such self-assembling lipids are typically synthetically modified biological lecithins which have been modified to include polymerizable (i.e. cross-linkable) groups such as diacetylenes, methacrylates, vinyl groups, and thiol groups, typically in a fatty acid side chain.

Preferred organic solvents are those having a dielectric constant of 25-80. The concentration of the lipid is typically selected to be less than about 1.5 mg of lipid per ml of organic solvent. The temperature of the solution is typically brought initially to between about 10-30 degrees Centigrade above the melting point of the lipid and then slowly cooled over at least about 90-120 minutes to a temperature below the melting point of the lipid, typically to about 10-30 degrees, below the melting point of the selected lipid I. The tubular aggregates will continue to grow in length from the dissolved lipid over time. According to the invention such tubular (hollow, open-ended cylinders) lipid aggregates are typically allowed to grow to selected lengths, in part, by allowing the formation solution to sit in an environment shielded from radiation which may polymerize the selected lipid I for the period of time during which tubule growth may occur.

After tubule growth for the preselected period of time, the tubules thus formed may, if polymerizable, be ruggedized by polymerization of the lipid. Such polymerization is typically carried out by subjecting the mixture to high energy radiation, such as ultraviolet, X ray, electron beam, gamma radiation or other radiation which may initiate polymerization and/or reaction within or between lipid molecules. Gamma radiation is most preferred to the extent it is less susceptible to scattering and absorption and thus typically effects homogeneous irradiation. The relatively structurally unstable tubules formed in the dry organic solvent are structurally locked into (hardened) their tubular form upon irradiation and thus more readily retain their hardened structural form for subsequent use in the fabrication of propellants, resistive elements in small electronic circuits, separation membranes and the like.

The inventive process herein typically yields tubules having selected lengths of less than about 1500 microns. A reaction mixture having tubules which fall within a preselected range of length, e.g., 2-10, 2-20, 2-40, 5-20, 5-30, 5-50, 10-50, 10-100, 10-150, 10-300, 20-200, 30-100, and any desired similar restricted ranges having preselected medians may be accomplished by varying one or more of: (a) the time the lipid solution is allowed to sit shielded from high energy radiation; (b) the specific organic solvent(s) selected; (c) the temperature of the selected solvent medium during which tubule growth occurs; (d) the concentration of lipid used in the organic solvent solution; and (e) the period of time over which the lipid/solvent mixture is cooled to a temperature below the melting point of the lipid.

Although the inventive process herein ma yield microstructures in a selected formation solution whose lengths and diameters vary over preselected ranges formation solutions having microstructure lengths which vary by as little as plus or minus about 5 microns in standard deviation around a preselected median microstructure length may be achieved. The typical range of standard deviations in length around a preselected median length which may be achieved herein by preselecting the kind and amounts of organic solvents, temperature, concentration of lipid in solution and time of allowing the lipid to self-aggregate is from about 5 microns to about 100 microns in standard deviation. The typical range of standard deviations in diameter around a preselected median diameter which is achievable herein is between about 0.05 and about 0.3 microns. Typically the standard deviation in tubule length around a preselected median length is less than about 60% of the value of the preselected median length; and the standard deviation in tubule diameter around a preselected median diameter is typically less than about 25% of the value of the preselected median diameter. For example, if the preselected median length of tubules yielded in a preselected formation solution is about 170 microns, the solution will typically yield tubules having lengths which range in standard deviation around the 170 micron median by less than about 102 microns.

Following is one specific formation routine according to the invention and the results thereof. In the following example the above referenced phospholipid II, where m and p were selected as 8 and n and r were selected as 9, X and Y were selected as methyl, and Z was selected as phosphoryl choline ($DC_{23}PC$, the L-isomer thereof, or 1, 2-bis (10, 12-tricosadiynoyl)-sn-glycero-3-phosphocholine) is selected for exemplary use.

Acetonitrile was refluxed with phosphorous pentoxide for 1-1.5 hours at 82° C. to remove trace water therefrom. $DC_{23}PC$ was added to the dried solvent in an amount sufficient to bring the concentration of $DC_{23}PC$ to 1-1.5 mg/ml. The solution was slowly heated to a temperature of between about 40 50° C. and slowly cooled over 1.5-2 hours to between about 15-25° C. Tubules about 10-50 microns in length and having a diameter of about 0.5 microns were formed and observed by light microscopy. Spherulites (sheet-like lamellar structures) and focal conic domains were also formed and observed under cross-polymerization.

It will now be apparent to those skilled in the art that other embodiments, improvements, details, and uses can be made consistent with the letter and spirit of the foregoing disclosure and within the letter and spirit of the foregoing disclosure and within the scope of this patent, which is limited only by the following claims, construed in accordance with the patent law, including the doctrine of equivalents.

What is claimed is:

1. Process for forming tubular microstructures of selected shape and dimension from surfactants comprising the steps of:
   selecting a lipid which self-assembles into a tubular microstructure;
   selecting a lipid solvating organic solvent in which the tubules form;
   removing essentially all water from the selected organic solvent;
   dissolving the selected lipid in the dried organic solvent;
   allowing the dissolved lipid to grow into the tubular microstructures in the dried organic solvent for a selected period of time and at a temperature below the melting point of the selected lipid.

2. The process of claim 1 wherein the selected organic solvent has a dielectric constant of between about 25 and about 80.

3. The process of claim 2 wherein the step of allowing comprises bringing the temperature of the dried organic solvent to at least about 15° C. above the melting point of the selected lipid and slowly cooling the organic solvent to a temperature at least about 15° C. below the melting point of the selected lipid over at least about 90 minutes.

4. The process of claim 3 wherein the organic solvent is selected from the group consisting of acetonitrile, dimethylamine, dibutylamine, polyethylene glycol l-butanol, t-butanol, amyl alcohol, diethylamine, dibutylamine, triethylamine, acetone, and DMSO.

5. The process of claim 2 wherein the organic solvent is selected from the group consisting of acetonitrile, dimethylamine, dibutylamine, polyethylene glycol l-butanol, t-butanol, amyl alcohol, diethylamine, dibutylamine, triethylamine, acetone, and DMSO.

6. The process of claim 1 wherein the step of allowing comprises bringing the temperature of the dried organic solvent to at least about 15° C. above the melting point of the selected lipid and slowly cooling the solution to a temperature at least about 10° C. below the melting point of the selected lipid over at least about 90 minutes.

7. The process of claim 6 wherein the organic solvent is selected from the group consisting of acetonitrile, dimethylamine, dibutylamine, polyethylene glycol l-butanol, t-butanol, amyl alcohol, diethylamine, dibutylamine, triethylamine, acetone, and DMSO.

8. The process of claim 1 wherein the organic solvent is selected from the group consisting of acetonitrile, dimethylamine, dibutylamine, polyethylene glycol l-butanol, t-butanol, amyl alcohol, diethylamine, dibutylamine, triethylamine, acetone, and DMSO.

9. Process for forming microstructures selected from the group consisting of tubules, spherulites and focal conic domains and mixtures thereof from surfactants comprising the steps of:
   selecting a lipid which self-assembles into the microstructures in solution;
   selecting a lipid solvating organic solvent in which the microstructures form;
   removing essentially all water from the selected organic solvent;
   dissolving the selected lipid in the dried organic solvent; and
   allowing the dissolved lipid to self-assemble into the selected microstructures in the dried organic solvent for a selected period of time and at a temperature below the melting point of the selected lipid.

10. The process of claim 9 wherein the selected organic solvent has a dielectric constant of between about 25 and about 80.

11. The process of claim 10 wherein the step of allowing comprises bringing the temperature of the dried organic solvent to at least about 15° C. above the melting point of the selected lipid and slowly cooling the solution to a temperature at least about 15° C. below the melting point of the selected lipid over at least about 90 minutes.

12. The process of claim 11 wherein the organic solvent is selected from the group consisting of acetonitrile, dimethylamine, dibutylamine, polyethylene glycol, l-butanol, t-butanol, amyl alcohol, diethylamine, dibutylamine, triethylamine, acetone, and DMSO.

13. The process of claim 9 wherein the step of allowing comprises bring the temperature of the dried organic solvent to at least about 15° C. above the melting point of the selected lipid and slowly cooling the solution to a temperature at least about 15° C. below the melting point of the selected lipid over at least about 90 minutes.

14. The process of claim 9 wherein the organic solvent is selected from the group consisting of acetonitrile, dimethylamine, dibutylamine, polyethylene glycol, l-butanol, t-butanol, amyl alcohol, diethylamine, dibutylamine, triethylamine, acetone, and DMSO.

* * * * *